United States Patent
Chern et al.

[19]

[11] Patent Number: 6,124,161
[45] Date of Patent: Sep. 26, 2000

[54] METHOD FOR FABRICATING A HEMISPHERICAL SILICON GRAIN LAYER

[75] Inventors: Horng-Nan Chern, Tainan Hsien; Kevin Lin, Taipei Hsien; Kun-Chi Lin, Hsinchu, all of Taiwan

[73] Assignee: United Microelectronics Corp., Hsinchu, Taiwan

[21] Appl. No.: 09/203,022

[22] Filed: Dec. 1, 1998

[51] Int. Cl.[7] .............................................. H01L 21/8234
[52] U.S. Cl. ............................ 438/238; 438/195; 437/60
[58] Field of Search ................................... 438/238, 195; 437/60

[56] References Cited

U.S. PATENT DOCUMENTS

| | | | |
|---|---|---|---|
| 5,639,685 | 6/1997 | Zahurak et al. | 437/60 |
| 5,877,052 | 3/1999 | Lin et al. | 438/238 |
| 5,913,119 | 6/1999 | Lin et al. | 438/255 |

*Primary Examiner*—Amir Zarabian
*Assistant Examiner*—Pho Luu
*Attorney, Agent, or Firm*—Hickman Coleman & Hughes, LLP

[57] ABSTRACT

A method for forming a hemispherical silicon grain (HSG) layer on a polysilicon electrode is provided. The method is suitable for a substrate, which has a dielectric layer over the substrate with an opening to expose the substrate, and a polysilicon layer is formed over the substrate. A portion of the polysilicon layer is removed above dielectric layer other than the opening region. Each sidewall of the polysilicon layer is slanted so that a trapezoidal polysilicon base is formed. A buffer layer is formed over the trapezoidal polysilicon base. An ion implantation process is performed to form an amorphous silicon layer with sufficient depth on a top surface region of the trapezoidal polysilicon base. The buffer layer includes silicon oxide or silicon nitride. During ion implantation, oxygen or nitrogen elements can also be bombarded into the amorphous silicon layer so as to buffer the amorphous silicon layer to be re-crystallized. A selective HSG layer is formed on the trapezoidal polysilicon electrode base.

20 Claims, 4 Drawing Sheets

METHOD FOR FABRICATING A HEMISPHERICAL SILICON GRAIN LAYER

BACKGROUND OF THE INVENTION

1. Field of the Invention

This invention relates to semiconductor fabrication, and more particularly to a method for fabricating a hemispherical silicon grain (HSG) layer on a capacitor electrode so as to increase the surface area.

2. Description of Related Art

A capacitor generally includes two electrodes and a dielectric layer between these two electrodes. In order to increase capacitance, either the dielectric thickness is reduced or the electrode area is increased. One of methods of increasing the electrode area is to use a polysilicon layer with a selective HSG layer on its top surface as a lower electrode. Since the selective HSG layer includes a lot of small hemispherical structures, the total area is naturally increased so that the capacitance is accordingly increased. However, the selective HSG layer is not easily formed on the polysilicon layer. The selective HSG layer is usually first formed on an amorphous silicon layer, and an annealing process is performed to transform the amorphous silicon layer into the polysilicon layer.

FIGS. 1A–1E are cross-sectional views of a portion of a semiconductor substrate, schematically illustrating conventional fabrication processes for forming a lower electrode of a capacitor with a HSG layer. In FIG. 1A, a dielectric layer 102 is formed over a substrate 100. An opening 104 is formed in the dielectric layer 102 to expose a portion of the substrate 100.

In FIG. 1B, an amorphous silicon layer 106 with a thickness of about 8000 Å is formed over the substrate 100 so that the opening 104 is filled also. The amorphous silicon layer 106 is doped with a dopant of, for example, phosphorus or arsenic so as to increase the conductance. The dopant concentration is about $10^{15}$ 1/cm$^3$. The amorphous silicon layer 106 is formed by chemical vapor deposition (CVD). However, the amorphous silicon layer 106 has a very long formation time of about 12–16 hours.

In FIG. 1C, the amorphous silicon layer 106 is patterned and becomes an amorphous silicon layer 106a that fills the opening 104 and covers a layer 102 around the opening 104. A portion of the amorphous silicon layer 106a remains exposed.

In FIG. 1D, a selective HSG layer 110 is formed over a peripheral surface of the exposed portion of the amorphous silicon layer 106a. Since the selective HSG layer 110 includes a lot of hemispherical silicon grains, the total surface area increases. This can increase the surface area of a lower electrode of a capacitor formed later.

In FIG. 1E, an annealing process is globally performed so as to transform the amorphous silicon layer 106a into a polysilicon layer 106b. The selective HSG layer 110 and the polysilicon layer 106b form together as a lower electrode 112. However, due to the annealing process, an oxide layer 114 may form at the interface between the lower electrode 112 and the substrate 100. This oxide layer 114 increases contact resistance of the lower electrode 112 to the substrate 100, which increased contact resistance worsens performance.

Another conventional method for fabricating a lower electrode of a capacitor uses a polysilicon base layer as a base of the lower electrode, like the amorphous silicon layer 106a in FIG. 1C. The exposed surface of the polysilicon base layer is implanted with ions to form a doped polysilicon bas layer with an amorphous surface layer on its exposed surface. A selective HSG layer like the selective HSG layer 110 of FIG. 1D is formed over the exposed surface of the doped polysilicon base layer. This alternative conventional method can reduce the fabrication time because it takes shorter time to form the polysilicon base layer. The doped polysilicon base layer can also prevent the oxide layer 114 of FIG. 1D from occurring. However, the implanted ions on the exposed surface of the polysilicon base layer has an insufficient concentration distribution so that quality of the grain structure of the selective HSG layer on the doped polysilicon base layer is poor. Moreover, during the formation of the selective HSG layer, the amorphous surface layer of the doped polysilicon base layer may be gradually re-crystallized, and transformed into polysilicon so that the selective HSG layer is not formed.

The conventional methods described above mainly have two issues. If the lower electrode is formed by forming the HSG layer 110 on the amorphous silicon layer 106a, the contact resistance to the substrate is increased. If the lower electrode is formed by forming the HSG layer on the doped polysilicon base layer, the HSG layer may be poor in quality or may even not be formed.

SUMMARY OF THE INVENTION

It is therefore an objective of the present invention to provide a method for forming a hemispherical silicon grain (HSG) layer on a polysilicon electrode, which has sufficient implanted ion concentration distribution. The quality of the HSG layer can be maintained or even improved.

In accordance with the foregoing and other objectives of the present invention, a method for forming a hemispherical silicon grain (HSG) layer on a polysilicon electrode is provided. The method is suitable for a substrate, which has a dielectric layer over the substrate with an opening to expose the substrate, and a polysilicon layer formed over the substrate. The polysilicon layer is doped. The method includes removing a portion of the polysilicon layer above the dielectric layer, other than the opening region. Each sidewall of the polysilicon layer is slanted so that the remaining polysilicon layer forms a trapezoidal polysilicon base, which has the right sidewall with an angle greater than 90°, and the left sidewall with an angle less than 90°. A buffer layer is formed over the trapezoidal polysilicon base. An ion implantation process with slanted incident angles relative to the vertical direction is performed to form an amorphous silicon layer on a top surface region of the trapezoidal polysilicon base, in which the implanted ions penetrate the buffer layer. The buffer layer includes a buffer material, such as silicon oxide or silicon nitride, both of which include oxygen or nitrogen. The buffer material can extend the re-crystallization time of the amorphous silicon layer so that it re-crystallizes behind during a subsequent HSG layer fabrication process. During ion implantation, buffer elements of the buffer layer can also be bombarded into the amorphous silicon layer on the trapezoidal polysilicon base. After the amorphous layer with sufficient depth is formed, the buffer layer is removed. A selective HSG layer is formed on the trapezoidal polysilicon electrode base.

Since the amorphous silicon layer includes the buffer elements, the amorphous silicon layer takes longer to re-crystallize during the formation of the selective HSG layer. The HSG can consequently be formed with a better quality. Moreover, since the amorphous silicon layer has sufficient depth, it also prolongs the re-crystallization time for the amorphous silicon layer so that the buffer effect is further increased.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 2A:
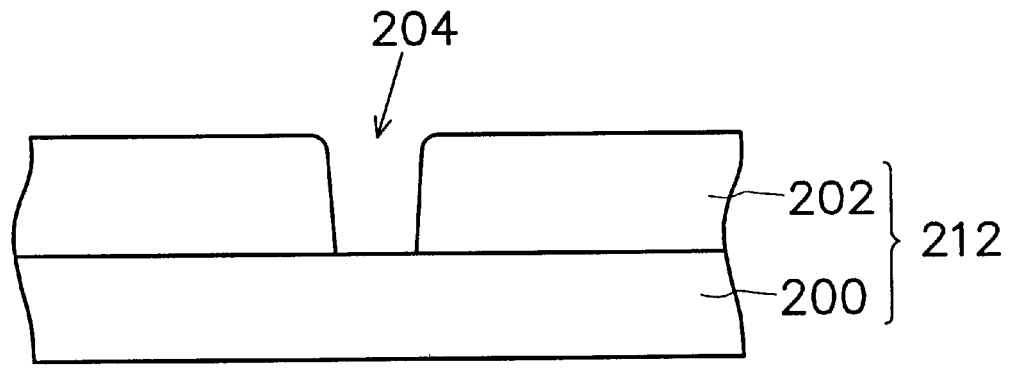
FIGS. 2A–2F are cross-sectional views of a portion of a semiconductor substrate, schematically illustrating fabrication processes for forming a lower electrode of a capacitor with a HSG layer, according to preferred embodiment of the invention.

FIGS. 2A–2F are cross-sectional views of a portion of a semiconductor substrate, schematically illustrating fabrication processes for forming a lower electrode of a capacitor with a HSG layer, according to preferred embodiment of the invention. In FIG. 2A, a dielectric layer 202 is formed on a semiconductor substrate 100. An opening 204 is formed to exposed the substrate 200.

Figure 1A:
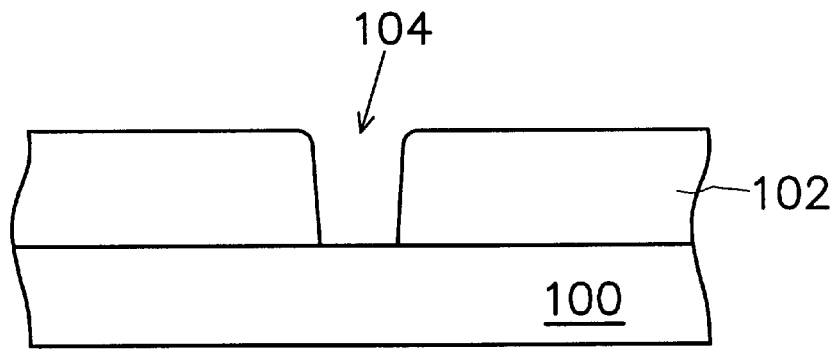
FIGS. 1A–1E are cross-sectional views of a portion of a semiconductor substrate, schematically illustrating conventional fabrication processes for forming a lower electrode of a capacitor with a HSG layer.
Figure 1B:
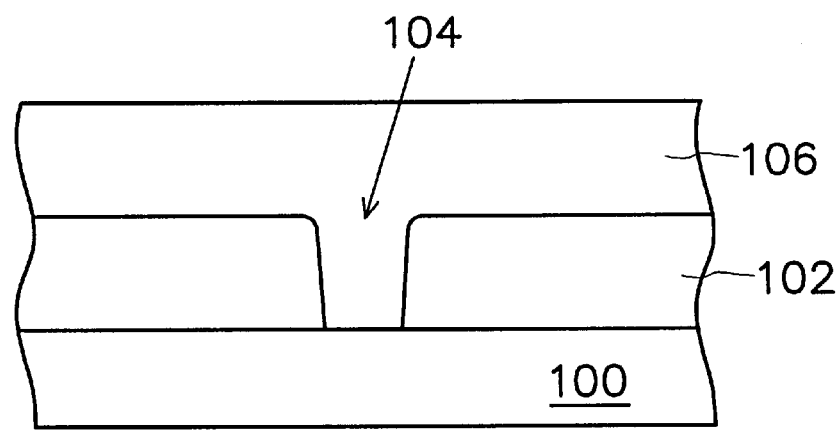
Figure 1C:
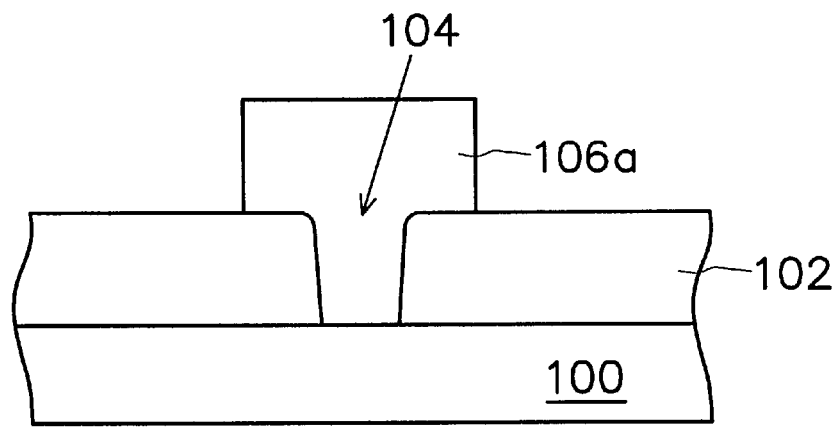
Figure 1D:
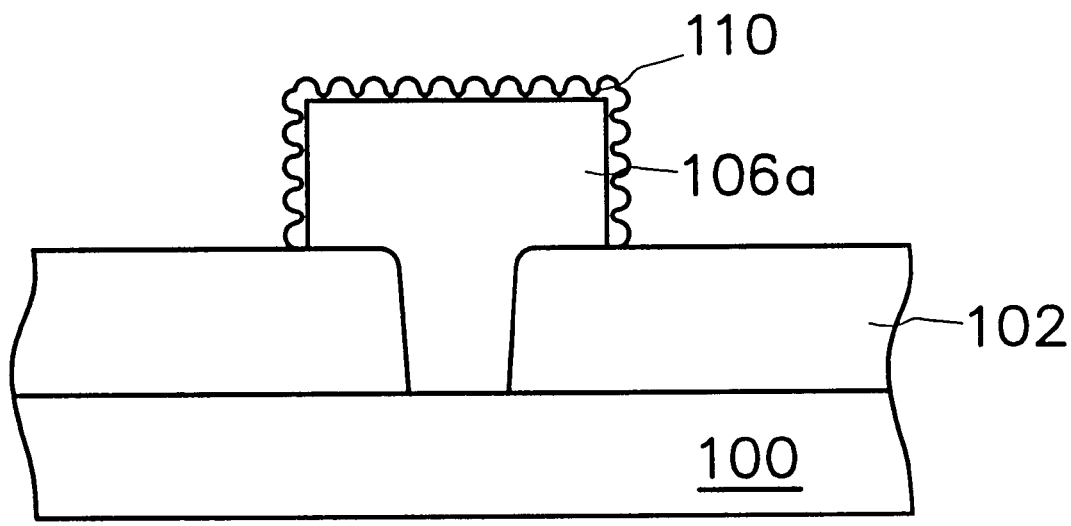
Figure 1E:
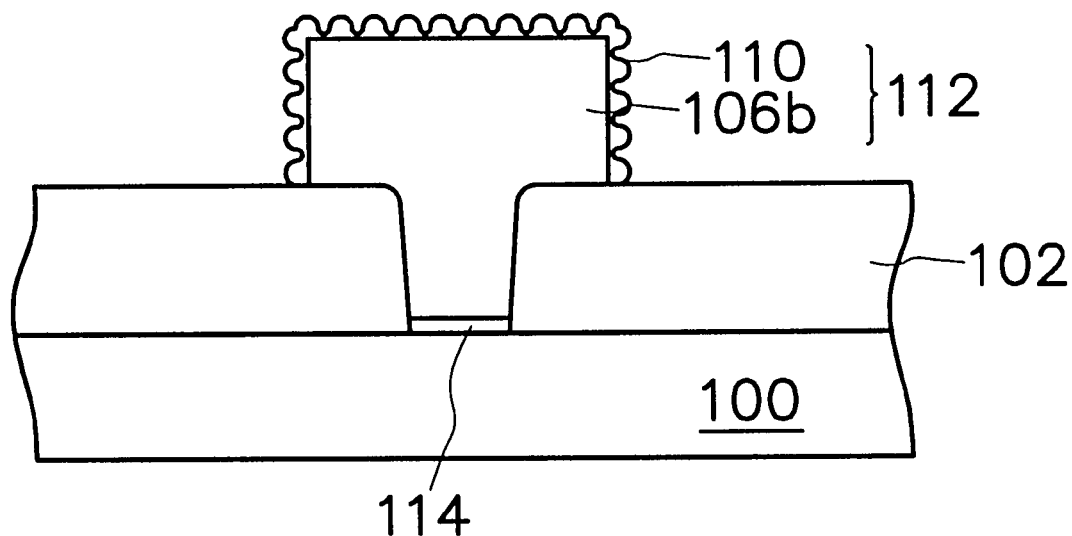
Figure 2B:
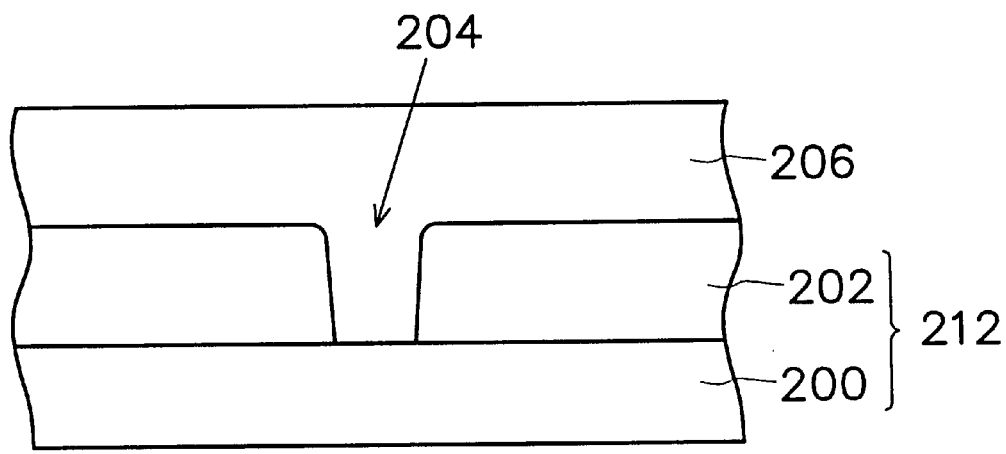

In FIG. 2B, a polysilicon layer 206 is formed over the substrate 200, in which the opening 204 is also filled. The polysilicon layer 206 has a thickness of about 8000 Å and is formed by, for example, chemical mechanical vapor deposition (CVD). During the CVD process, a dopant such as arsenic or phosphorus is simultaneously doped into the polysilicon layer 206 so as to increase its conductivity. The dopant concentration is about $10^{15}$ $1/cm^3$. The deposition of the polysilicon layer 206 with a thickness of about 8000 Å is much faster than the deposition of the conventional amorphous silicon layer 106 of FIG. 1B with the same thickness. The fabrication time can therefore be effectively reduced, and the production rate is increased. The polysilicon layer 206 can also prevent an oxide layer from being formed at the interface between the polysilicon layer 206 and the substrate 200 within the opening 204. The contact resistance is reduced.

Figure 2C:
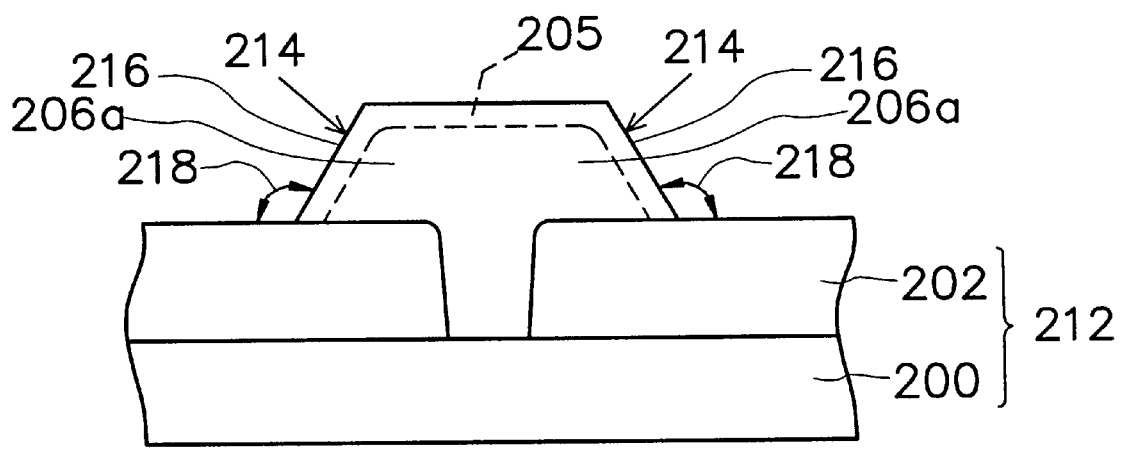

In FIG. 2C, patterning the polysilicon layer 206, a portion of polysilicon layer 206 other than that filling the opening 204 of FIG. 2B is removed. A remaining portion of the polysilicon layer 206 becomes a trapezoidal polysilicon base 206a. Each of sidewalls 214 of the trapezoidal polysilicon base 206a is slanted with an absolute angle 218 greater than 90 degrees so that the trapezoidal polysilicon base 206a has a wider bottom and a narrower top. The right one of the sidewalls 214 is slanted in a counterclockwise direction and the left one of the sidewalls 214 is slanted in a clockwise direction. This is helpful for an ion implantation process performed later. A top surface region 205 on the trapezoidal polysilicon base 206a is intended to be later transformed into an amorphous silicon. The patterning process to form the trapezoidal polysilicon base 206a includes forming a photoresist layer (not shown) with a trapezoidal pattern over the polysilicon layer 206 of FIG. 2B, and etching the polysilicon layer 206 by anisotropic etching. Then, the photoresist layer is removed.

Figure 2D:
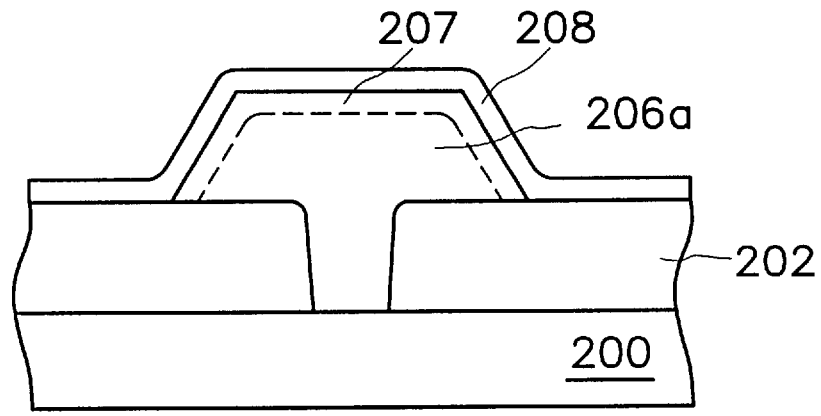

In FIG. 2D, a buffer layer 208 having a thickness of about 100 Å–500 Å is formed over the substrate 200 so that the trapezoidal polysilicon base 206a is also covered. The buffer layer 208 including silicon oxide or silicon nitride is one of characteristics in the invention. The buffer layer 208 delays re-crystallization of a later-formed amorphous silicon layer. The detailed mechanism is to be described later in FIG. 2E. If the buffer layer 208 includes silicon oxide, it can be formed by thermal oxidation, and if the buffer layer 208 includes silicon nitride, it can be, for example, formed by chemical vapor deposition (CVD). The top surface region 205 of FIG. 2C is an expected region, where an amorphous silicon layer is to be formed later. The trapezoidal polysilicon base 206a within the top surface region 205 is called a polysilicon surface layer 207.

Figure 2E:
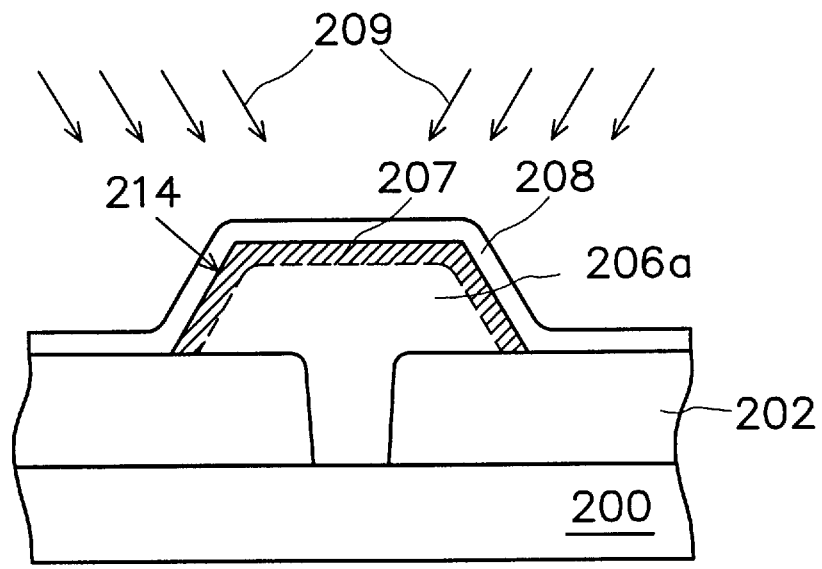

In FIG. 2E, an ion implantation process 209 is performed in situ to transform the polysilicon surface layer 207 into the amorphous silicon layer mentioned above by destroying its crystal structure. The polysilicon surface layer 207 becomes an amorphous silicon layer 207. Since the sidewalls 214 of the trapezoidal polysilicon base 206a are slanted, the ion implantation process 209 with positive and negative-slanted incident angles, with regard to the perpendicular of the substrate 200, can easily form the amorphous phous silicon layer 207 on the trapezoidal polysilicon base 206a. If the trapezoidal polysilicon base 206a includes arsenic, the ion beam energy preferably is about 120 KeV–300 KeV. If the trapezoidal polysilicon base 206a includes phosphorus, the ion beam energy preferably is about 100 KeV–200 KeV.

During the ion implantation process, the buffer elements of the buffer layer 208, such as silicon oxide or silicon nitride are simultaneously bombarded into the amorphous silicon layer 207. The oxygen or nitrogen contained in the buffer layer 208 can delay the re-crystallization of the amorphous silicon layer 207 until during the later formation of a selective HSG layer. Moreover, the buffer layer 208 also allows the ion implantation process to use a higher energy ion beam so that a larger concentration distribution of implanted ions can be obtained in the top surface region 205 of FIG. 2C.

The amorphous silicon layer 207 can be formed with better quality.

Figure 2F:
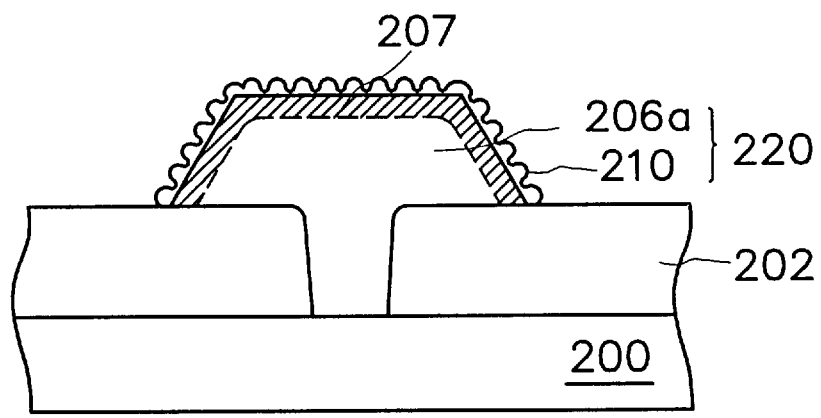

In FIG. 2F, after removing the buffer layer 208 by, for example, etching, a selective HSG layer 210 is formed on amorphous silicon layer 207. The selective HSG layer 210 and the trapezoidal polysilicon base 206a form together as a lower electrode 220 of a capacitor. During the formation of the HSG layer 210, the amorphous silicon layer 207 is re-crystallized. The oxygen or nitrogen bombarded into the buffer layer 208 can prolong the re-crystallization time of the amorphous silicon layer 207. Moreover, since the amorphous silicon layer 207 has greater ion concentration and depth, the selective HSG layer 210 can be formed with more buffer time. If the amorphous silicon layer 207 is re-crystallize, re-crystallization phenomenon physically starts from the inner part of the amorphous silicon layer 207. Since the thickness of the amorphous silicon layer 207 is sufficiently large, before the amorphous silicon layer 207 is re-crystallized during forming the selective HSG layer 210, the selective HSG layer 210 is already formed. The quality of the selective HSG layer 210 is not affected. The trapezoidal polysilicon base 206a and the selective HSG layer 210 form together to serve as a lower electrode of a capacitor.

In conclusion, the method of invention for forming a lower electrode with the selective HSG layer includes several characteristics as follows:

1. The buffer layer 208 allows the ion implantation process 209 to be performed with a higher beam energy. Ions can be implanted into the trapezoidal polysilicon base 206a with a higher concentration distribution on the surface of the trapezoidal polysilicon base 206a. This is helpful for the formation of the amorphous silicon layer 207 on the surface of the trapezoidal polysilicon base 206a.

2. The buffer layer includes a material, such as silicon oxide or silicon nitride. When the ion implantation process is performed, silicon oxide or silicon nitride can be bombarded into the trapezoidal polysilicon base 206a. The oxygen or nitrogen elements can delay re-crystallization of the amorphous silicon layer 207 until during formation of the selective HSG layer 210.

3. The invention includes the buffer layer formed on the trapezoidal polysilicon base 206a so that the ion implantation process with higher beam energy can form the amorphous silicon layer 207 with sufficient thickness. When a re-crystallization phenomenon occurs, it physically starts from the inner part of the amorphous silicon layer 207. Since the thickness of the amorphous silicon layer 207 is sufficiently large, the selective HSG layer 210 is already formed before the amorphous silicon layer 207 is recrystallized while forming the HSG layer 210.

4. Since the trapezoidal polysilicon base 206a has slanted sidewalls 214, the ion implantation with slanted incident angles can easily implant ions into the trapezoidal polysilicon base 206a to form the amorphous silicon layer 207, which is conformal to he surface of the trapezoidal polysilicon base 206a.

5. The method of the invention uses doped polysilicon as an capacitor electrode base, that is, the trapezoidal polysilicon base 206a, so that the fabrication time is reduced. Moreover, the oxide layer conventionally occurring at the interface between the trapezoidal polysilicon base 206a and the substrate 200 is avoided so that the contact resistance is effectively reduced.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for forming a hemispherical silicon grain (HSG) layer on a polysilicon layer, which is formed on a substrate, the method comprising:

forming a buffer layer over the polysilicon layer;

transforming a surface region of the polysilicon layer into an amorphous silicon layer;

removing the buffer layer; and forming the HSG layer on the polysilicon layer.

2. The method of claim 1, wherein the step of transforming the surface region of the polysilicon layer into an amorphous silicon layer comprises an ion implantation process.

3. The method of claim 2, wherein the ion implantation comprises a sufficiently high ion beam energy so as to form the amorphous silicon layer with a sufficient depth and a sufficient ion concentration.

4. The method of claim 3, wherein the ion implantation comprises an ion beam energy of about 100 KeV–200 KeV to implant phosphorus ions.

5. The method of claim 3, wherein the ion implantation comprises an ion beam energy of about 120 KeV–300 KeV to implant arsenic ions.

6. The method of claim 3, wherein the buffer layer comprises silicon oxide.

7. The method of claim 3, wherein the buffer layer comprises silicon nitride.

8. The method of claim 3, wherein the buffer layer comprises a thickness of about 100 Å–500 Å.

9. The method of claim 3, wherein the polysilicon layer comprises doped polysilion.

10. The method of claim 1, wherein the formation of the polysilicon layer further comprises:

forming a preliminary polysilicon layer over the substrate; and removing a portion of the preliminary polysilicon layer to form the polysilicon layer, wherein each sidewall of the polysilicon layer is slanted so that the polysilicon layer has a trapezoidal structure with a wider bottom and a narrower top.

11. The method of claim 1, wherein the buffer layer comprises silicon oxide.

12. The method of claim 1, wherein the buffer layer comprises silicon nitride.

13. The method of claim 1, wherein the buffer layer comprises a thickness of about 100 Å–500 Å.

14. The method of claim 1, wherein the polysilicon layer comprises doped polysilicon.

15. A method for forming a capacitor electrode, the method comprising:

providing a substrate;

forming a dielectric layer over the substrate with an opening to expose the substrate;

forming a polysilicon layer over the substrate to fill the opening, in which each sidewall of the polysilicon layer is slanted so that the polysilicon layer has a trapezoidal structure with a wider bottom and a narrower top;

forming a buffer layer over the polysilicon layer;

transforming a surface region of the polysilicon layer into an amorphous silicon layer;

removing the buffer layer; and forming a hemispherical silicon grain (HSG) layer on the polysilicon layer.

16. The method of claim 15, wherein the buffer layer comprises silicon oxide.

17. The method of claim 15, wherein the buffer layer comprises silicon nitride.

18. The method of claim 15, wherein the polysilicon layer is doped.

19. The method of claim 15, wherein the step of transforming the surface portion of the polysilicon layer into the amorphous silicon layer comprises an ion implantation process.

20. The method of claim 19, wherein the ion implantation process comprises a sufficiently high ion beam energy so as to form the amorphous silicon layer with a sufficient depth and a sufficient ion concentration.

* * * * *